US009705468B2

(12) United States Patent
Lee et al.

(10) Patent No.: US 9,705,468 B2
(45) Date of Patent: Jul. 11, 2017

(54) ADJUSTABLE HARMONIC FILTERING DEVICE

(71) Applicant: AIROHA TECHNOLOGY CORP., Hsinchu (TW)

(72) Inventors: Tao-Yi Lee, Hsinchu (TW); Bing-Jye Kuo, Hsinchu (TW); Hsuan-An Wei, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 230 days.

(21) Appl. No.: 14/594,254

(22) Filed: Jan. 12, 2015

(65) Prior Publication Data

US 2015/0244340 A1 Aug. 27, 2015

(30) Foreign Application Priority Data

Feb. 25, 2014 (TW) .............................. 103106208 A (51) Int. Cl.
| | |
|---|---|
| *H03H 7/46* | (2006.01) |
| *H03H 7/12* | (2006.01) |
| *H03H 7/01* | (2006.01) |
| *H03F 1/56* | (2006.01) |
| *H03F 3/195* | (2006.01) |

(Continued)

(52) U.S. Cl.
CPC ............. *H03H 7/461* (2013.01); *H03F 1/565* (2013.01); *H03F 3/195* (2013.01); *H03F 3/245* (2013.01); *H03F 3/68* (2013.01); *H03H 7/0115* (2013.01); *H03H 7/0153* (2013.01); *H03H 7/12* (2013.01); *H03H 7/175* (2013.01); *H03H 7/1758* (2013.01); *H03F 2200/111* (2013.01); *H03F 2200/222* (2013.01); *H03F 2200/387* (2013.01); *H03F 2200/451* (2013.01);

(Continued)

(58) Field of Classification Search
CPC ........ H01P 1/213; H03H 7/0153; H03H 7/09; H03H 7/38; H03H 7/383; H03H 7/461; H03H 7/46; H03H 7/12; H03H 7/0115
USPC ................ 333/126, 132, 174, 129, 138, 175
See application file for complete search history.

(56) References Cited

U.S. PATENT DOCUMENTS

| | | | |
|---|---|---|---|
| 5,973,568 A | 10/1999 | Shapiro et al. | |
| 2008/0129122 A1 | 6/2008 | Yu et al. | |

(Continued)

FOREIGN PATENT DOCUMENTS

| | | |
|---|---|---|
| CN | 102324601 A | 1/2012 |
| TW | 201310772 A1 | 3/2013 |

*Primary Examiner* — Stephen E Jones
*Assistant Examiner* — Rakesh Patel
(74) *Attorney, Agent, or Firm* — Rosenberg, Klein & Lee (57) ABSTRACT

The present invention is related to an adjustable harmonic filtering device, mainly comprising a first connecting port, a second connecting port, a harmonic filtering unit, and an adjusting unit, in which a passive network is presented between the first connecting port and the second connecting port, as well as the harmonic filtering unit is connected to the passive network. The harmonic filtering unit comprises a first inductor and a first capacitor. The adjusting unit is adjacent to the first inductor of the harmonic filtering unit, and induced electromagnetically therewith. Thus, frequency-band of the harmonic, to be filtered out by the harmonic filtering unit, may be changed, allowing for reducing loss of signal occurring in the process of transmission between the first connecting port and the second connecting port effectively.

8 Claims, 6 Drawing Sheets

(51) Int. Cl.
 H03F 3/24 (2006.01)
 H03F 3/68 (2006.01)
 H03H 7/06 (2006.01)
 H03H 7/09 (2006.01)

(52) U.S. Cl.
 CPC ............... H03H 7/06 (2013.01); H03H 7/09 (2013.01); H03H 2007/013 (2013.01)

(56) References Cited

U.S. PATENT DOCUMENTS

| | | | | |
|---|---|---|---|---|
| 2011/0068882 A1* | 3/2011 | Honda | ................ | H01P 1/2039 333/202 |
| 2013/0049900 A1* | 2/2013 | Chung | ................ | H01P 1/20381 333/204 |
| 2013/0207872 A1* | 8/2013 | Bakalski | ............. | H04B 1/0458 343/860 |

* cited by examiner

ADJUSTABLE HARMONIC FILTERING DEVICE

FIELD OF THE INVENTION

The present invention is related to an adjustable harmonic filtering device, capable of adjusting frequency-band of harmonic to be filtered out, so as to reduce interference occurring in the process of signal transmission.

BACKGROUND

Figure 1:
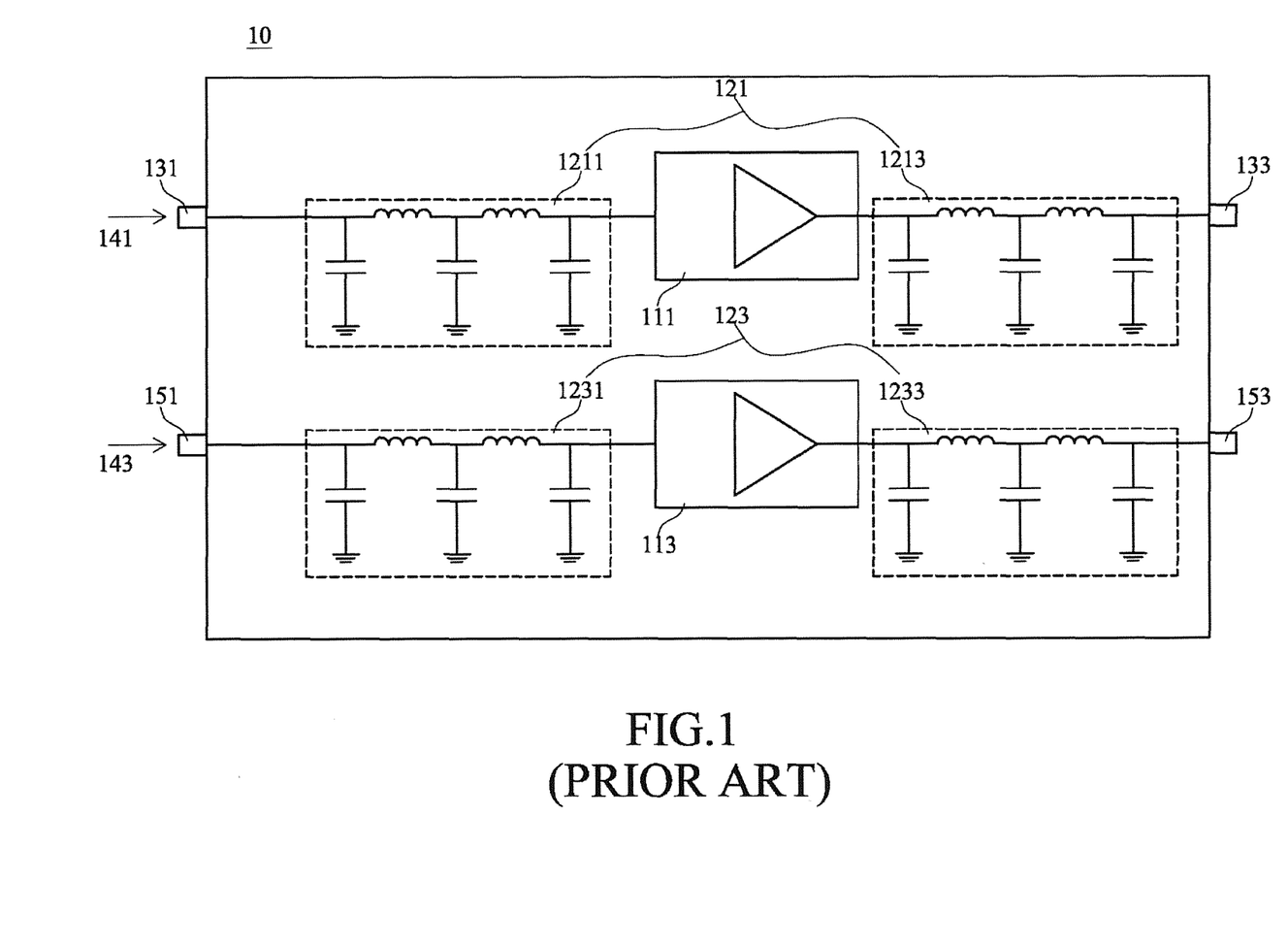
FIG. 1 is a block diagram of a conventional RF emitter.

Referring to FIG. 1, there is shown a block diagram of a conventional radio-frequency (RF) emitter. A RF emitter 10, used for emitting RF signals mainly comprises a plurality of amplifying units 111/113, a plurality of input ports 131/151, a plurality of output ports 133/153, and a plurality of passive networks 121/123. In this connection, the passive networks 121/123 are located between the input ports 131/151 and the corresponding output ports 133/153, respectively, while the amplifying units 111/113 are located in the corresponding passive networks 121/123, respectively.

The first passive network 121 comprises a first input passive network 1211 and a second output passive network 1213. In this case, the first input port 131 is connected to the first output port 133 via the first input passive network 1211 and the first output passive network 1213. Between the first input passive network 1211 and the first output passive network 1213, there is provided with a first amplifying unit 111, by which a first RF signal 141 inputted from the first input port 131 is amplified. Subsequently, the amplified first RF signal 141 is then sent to the first output port 133. In the first input passive network 1211 and the first output passive network 1213, a plurality of capacitors and inductors are provided. Moreover, suitable capacitors and inductors are selected cooperatively, such that impedance in the first input passive network 1211 and that in the first output passive network 1213 may meet expectations. For instance, impedance presented in the first input passive network 1211 with respect to the frequency-band of the first RF signal 141 may become low.

The second passive network 1231 comprises a second input passive network 1231 and a second output passive network 1233. In this case, the second input port 151 is connected to the second output port 153 via the second input passive network 1231 and the second output passive network 1233. Between the second input passive network 1231 and the second output passive network 1233, there is provided with a second amplifying unit 113, such that a second RF signal 143 inputted from the second input port 151 may be allowed to pass through the second amplifying unit 113, by which the second RF signal 143 inputted from the second input port 151 is amplified. Subsequently, the amplified second RF signal 143 is then sent to the second output port 153. In the second input passive network 1231 and the second output passive network 1233, a plurality of capacitors and inductors are provided. Moreover, suitable capacitors and inductors are selected cooperatively, such that impedance in the second input passive network 1231 and that in the second output passive network 1233 may meet expectations. For instance, impedance presented in the second input passive network 1231 with respect to the frequency-band of the second RF signal 143 may become low.

Lower impedance may be presented in the first input passive network 1211 and the second input passive network 1231 with respect to RF signals in different frequency-bands, respectively. In practical application, therefore, RF signals may be sent in different input passive networks 1211/1231 selectively on the basis of frequency thereof, so as to enhance efficiency in signals transmission. For instance, the first input passive network 1211 is used as the input passive network for the first RF signal 141, while the second input passive network 1231 is used as the input passive network for the second RF signal 143, in which the frequency-band of the first RF signal 141 is different from that of the second RF signal 143.

When the above RF emitter 10 is provided, RF transceiving in several independent frequency-bands may be provided on one single module, and the highest efficiency of signal transmission may be achieved together with the reduction of harmonic interference occurring in the process of transmission of RF signal by designing the passive network with respect to the RF signals 141/143. The number of passive networks and amplifying units in the RF emitter 10, however, certainly be increased along with more different frequency-bands included in the RF signals to be emitted. In this way, the size and setup cost of RF emitter 10 should be increased.

SUMMARY OF THE INVENTION

It is one object of the present invention to provide an adjustable harmonic filtering device, allowed for adjusting frequency-band of harmonic to be filtered out, primarily be means of electromagnetic induction, feed-back, feed-forward, and/or digital assistance, and etc., so as to reduce loss in the process of signal transmission.

It is a further object of the present invention to provide an adjustable harmonic filtering device, comprising a harmonic filtering unit and an adjusting unit. A first inductor in the harmonic filtering unit is adjacent to a second inductor in the adjusting unit. Moreover, electromagnetic induction is generated between the first inductor and the second inductor. Thus, frequency-band of harmonic to be filtered out by the harmonic filtering unit is adjusted.

It is a further object of the present invention to provide an adjustable harmonic filtering device, applied to and provided in a RF transmitter. In this case, the adjustable harmonic filtering device is connected at one end thereof to an amplifying unit, while at the other end thereof to an antenna unit. Moreover, frequency-band of harmonic to be filtered out by the adjustable harmonic filtering device is adjusted on the basis of the frequency-band of signal sent to the antenna unit from the amplifying unit, so as to reduce loss in the process of signal transmission from the amplifying unit to the antenna unit.

It is a further object of the present invention to provide a RF transmitter, in which the output terminal of an amplifying unit is connected to an adjustable harmonic filtering device, while the input terminal thereof is connected to a power combiner. The power combiner comprises a plurality of matching networks, each of which is connected to each other via at least one resistor, such that capacitors and/or inductors of one matching network may be shared with other matching networks. Thus, the size and manufacturing cost of RF transmitter and power combiner may be reduced effectively.

To achieve these and other objects of the present invention, the present invention provides an adjustable harmonic filtering device, comprising: a first connecting port; a second connecting port, wherein a passive network is presented between the first connecting port and the second connecting port; a harmonic filtering unit, connected to the passive network, and comprising at least one first capacitor and at least one first inductor, wherein the first inductor is connected to the first capacitor in series; and an adjusting unit, adjacent to the first inductor of the harmonic filtering unit, and induced electromagnetically with the first inductor, so as to change frequency-band of harmonic to be filtered out by the harmonic filtering unit.

In one embodiment of adjustable harmonic filtering device, the adjusting unit comprises a second inductor, the second inductor being adjacent to the first inductor of the harmonic filtering unit, and induced electromagnetically with the first inductor.

In one embodiment of adjustable harmonic filtering device, the adjusting unit further comprises at least one variable capacitor and at least one resistor, the variable capacitor and the resistor being electrically connected to the second inductor.

In one embodiment of adjustable harmonic filtering device, the adjusting unit further comprises a band-pass filtering unit and a variable delay unit, the second inductor being electrically connected to the first connecting port via the band-pass filtering unit and the variable delay unit.

In one embodiment of adjustable harmonic filtering device, the first connecting port is electrically connected to an amplifying unit, while the second connecting port is electrically connected to an antenna unit.

In one embodiment of adjustable harmonic filtering device, a RF signal is sent to the antenna unit from the amplifying unit via the passive network.

In one embodiment of adjustable harmonic filtering device, the adjusting unit comprises a variable capacitor and a resistor, the variable capacitor and the resistor being electrically connected to the second inductor, and capacitance of the variable capacitor being adjusted on the basis of frequency-band of the RF signal, so as to change frequency of harmonic to be filtered out by the harmonic filtering unit.

In one embodiment of adjustable harmonic filtering device, the adjusting unit further comprises a band-pass filtering unit and a variable delay unit, the second inductor being electrically connected to the first connecting port via the band-pass filtering unit and the variable delay unit, phase delay of the variable delay unit being adjusted on the basis of frequency-band of the RF signal.

In one embodiment of adjustable harmonic filtering device, further comprises a power combiner, wherein the power combiner comprises a plurality of matching networks, each of the matching networks comprising at least one capacitor and at least one inductor.

In one embodiment of adjustable harmonic filtering device, each of the matching networks is connected to each other via at least one resistor.

In one embodiment of adjustable harmonic filtering device, the harmonic filtering unit further comprises at least one inductor or at least one capacitor, provided in the passive network between the first connecting port and the second connecting port.

In one embodiment of adjustable harmonic filtering device, the harmonic filtering unit is connected at at least one end thereof to the passive network between the first connecting port and the second connecting port.

Although the embodiments of the present invention are illustrated in the figures by way of example, and described in detail in the text, various modifications and alternatives are still allowed. The figures of the present invention may be not drawn to scale. The figures and detailed description therefor may be only specific disclosure, and not used for limiting the present invention. In contrast, modifications, equivalent components, and substitutions on the basis of spirits and scopes of Claims are all covered by the present invention.

DETAILED DESCRIPTION

Figure 2:
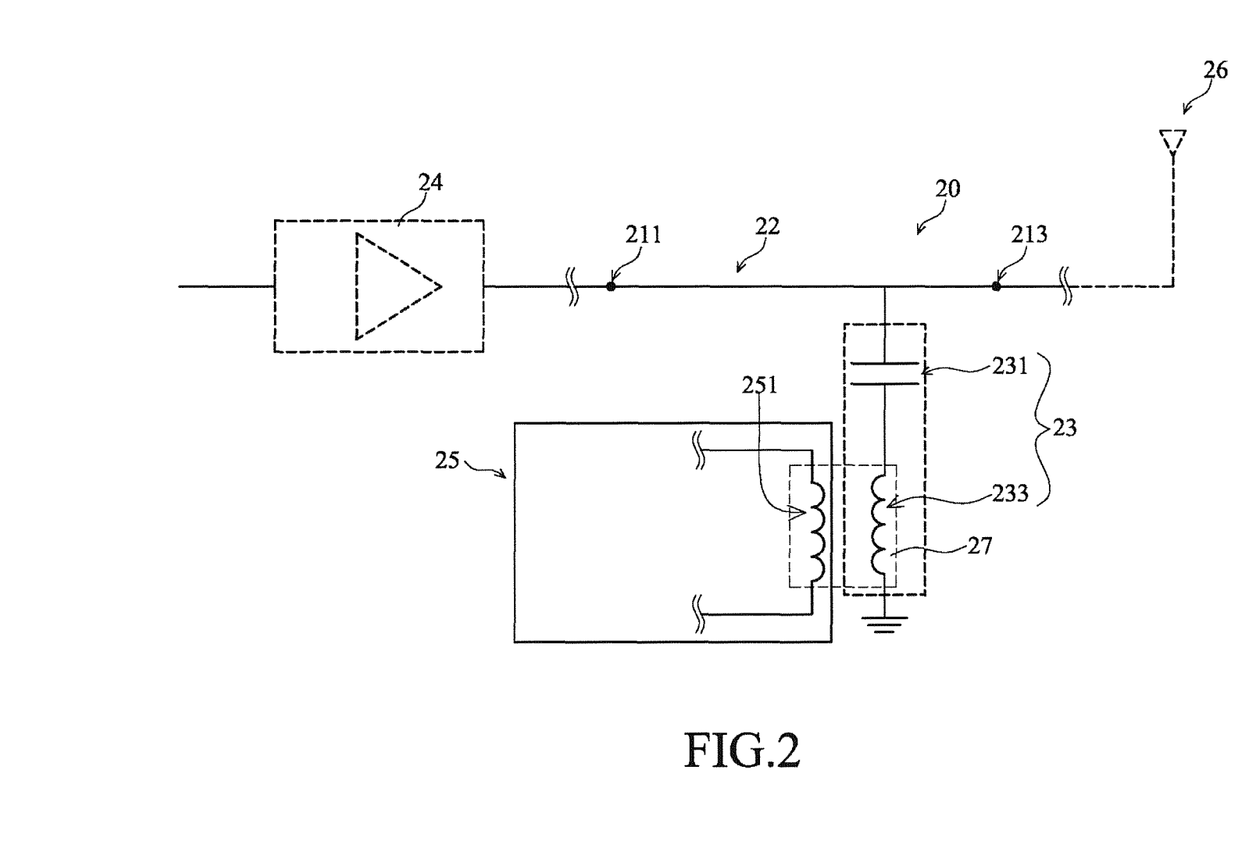
FIG. 2 is a structural diagram of an adjustable harmonic filtering device according to one embodiment of the present invention.

Referring to FIG. 2, there is shown a structural diagram of an adjustable harmonic filtering device according to one embodiment of the present invention. As illustrated in the figure, an adjustable harmonic filtering device 20 described in the present embodiment comprises a first connecting port 211, a second connecting port 213, a harmonic filtering unit 23, and an adjusting unit 25. In this connection, a passive network 22 is presented between the first connecting port 211 and the second connecting port 213, such that a signal (such as RF signal, for example) is inputted from the first connecting port 211 in operation, and the inputted signal may be sent to the second connecting port 213 via the passive network 22.

The harmonic filtering unit 23 is connected to the passive network 22. For instance, the harmonic filtering unit 23 is connected at at least one end thereof to the passive network 22. The harmonic filtering unit 23 comprises at least one first capacitor 231, at least one first inductor 233, in which the first capacitor 231 is connected to the first inductor 233 in series.

In one embodiment of the present invention, the first capacitor 231 and the first inductor 233 connected in series may be electrically connected at one end thereof to the passive network 22. For instance, the first capacitor 231 and the first inductor 233 connected in series may be connected at one end thereof to the passive network 22, while at the other end thereof to the ground. For the convenience of description, the harmonic filtering unit 23 drawn in FIG. 2 only comprises one first capacitor 231 and one first inductor 233 connected in series. In practical application, however, there may be possibly a plurality of first capacitors 231 and first inductors 233. In addition, the first inductor 233 in FIG. 2 is connected to the passive network 22 via the first capacitor 231. In practice application, nevertheless, it is also possible for the first capacitor 231 to connect the passive network 22 via the first inductor 233.

The adjusting unit 25 is adjacent to the first inductor 233, and not DC coupled with to the first inductor 233. In the embodiment of the present invention, the adjusting unit 25 comprises a second inductor 251 therein. In this case, the second inductor 251 and the first inductor 233 are adjacent to each other, such that electromagnetic induction may be generated therebetween.

When electromagnetic induction is generated between the first inductor 233 and the second inductor 251, frequency-band of the harmonic to be filtered out by the harmonic filtering unit 23 may be changed. For instance, a balanced-to-unbalanced transformer 27 may be formed by the first inductor 233 and the second inductor 251. In practical application, therefore, the frequency-band and suppression of the harmonic to be filtered out by the harmonic filtering unit 23 may be adjusted via the change in resonant frequency of harmonic filtering unit 23, resonant frequency of adjusting unit 25, and/or coupling coefficient of balanced-to-unbalanced transformer 27.

In one embodiment of the present invention, intensity of electromagnetic induction between the first inductor 233 and the second inductor 251 is adjusted on the basis of frequency-band of RF signal inputted from the first connecting port 211, in such a way that impedance in the passive network 22 is presented as low impedance with respect to the frequency-band of RF signal to be sent desirably. Thereby, loss of RF signal in transmission may be reduced.

In practical application, intensity of electromagnetic induction between the first inductor 233 and the second inductor 251 may be adjusted via the active or passive circuit. In this connection, an active means may be used for changing the current through the second inductor 251, while a passive means may be used for changing impedance in the adjusting unit 25 and/or inductance of the second inductor 251. For the convenience of description, active or passive adjustment means will be detailed in subsequent embodiments of the present invention.

In one embodiment of the present invention, the adjustable harmonic filtering device 20 may be further applied to a RF transmitter. For instance, the first connecting port 211 may be connected to an amplifying unit 24, while the second connecting port 213 may be connected to an antenna unit 26, as illustrated in FIG. 2 with dashed line. In this case, the RF signal amplified by the amplifying unit 24 may be sent to the antenna unit 26 via the passive network 22. The above amplifying unit 24 with antenna unit 26, naturally, may be only provided as one of the embodiments of the present invention, and not for limiting the present invention.

Figure 3:
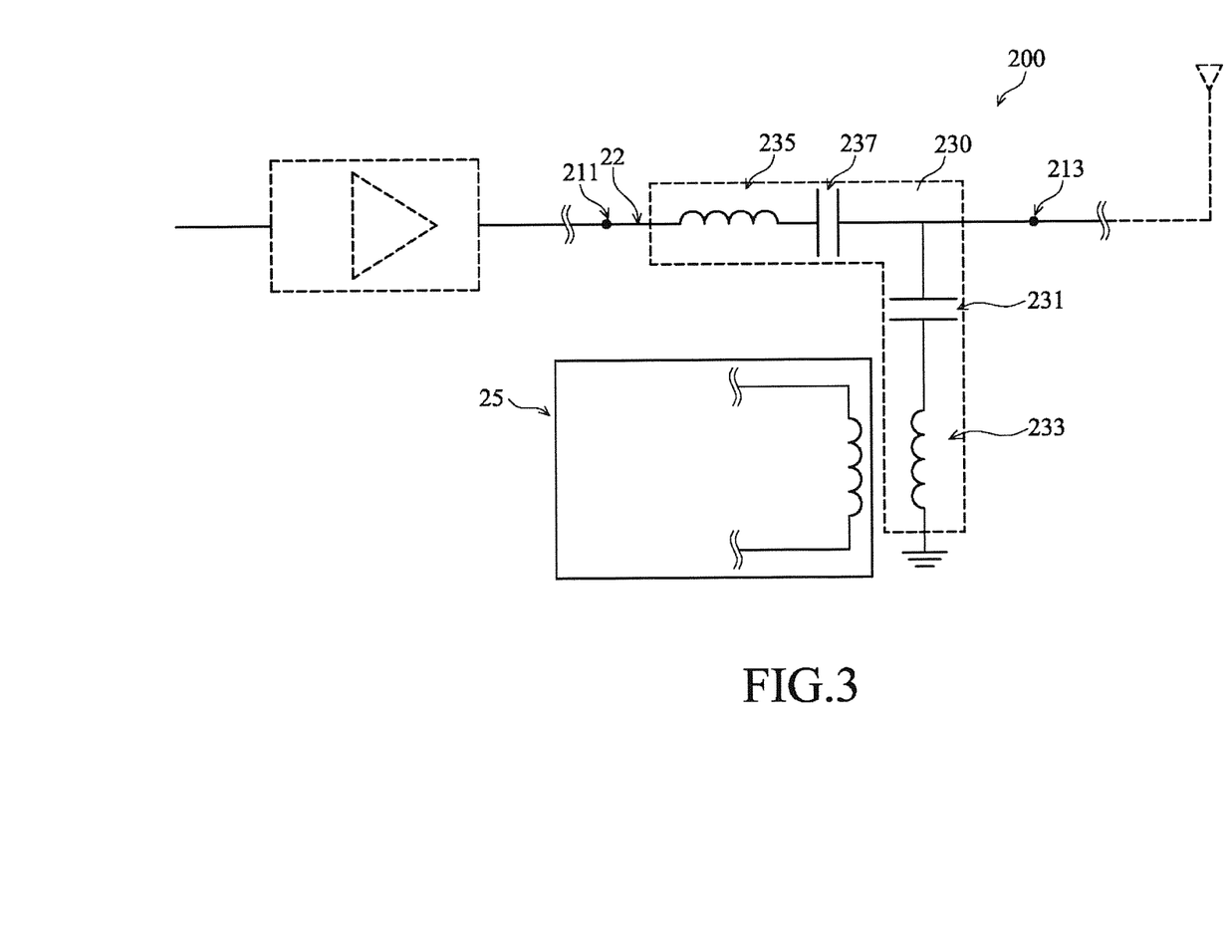
FIG. 3 is a structural diagram of an adjustable harmonic filtering device according to a further embodiment of the present invention.

In another embodiment of the present invention, referring to FIG. 3 cooperatively, a harmonic filtering unit 230 comprises at least one first capacitor 231, at least one first inductor 233, at least one inductor 235, and/or at least one capacitor 237. In this connection, the inductor 235 and/or the capacitor 237 may be provided in the passive network 22. For instance, the inductor 235 is connected to the capacitor 237 in series, as well as the inductor 235 with the capacitor 237 connected in series may be electrically connected at two ends thereof to the first connecting port 211 and the second connecting port 213, respectively. In addition, the first capacitor 231 is connected to the first inductor 233 in series, as well as the first capacitor 231 with the first inductor 233 connected in series may be connected at one end thereof to the passive network 22 between the first connecting port 211 and the second connecting port 213.

In practical application, the first capacitor 231, the first inductor 233, the capacitor 235, and/or the capacitor 237 within the harmonic filtering unit 230 may be cooperated with each other, such that harmonic in the specific frequency-band may be filtered out by the harmonic filtering unit 230. In addition, the frequency-band of the harmonic, which may be filtered out by the harmonic filtering unit 230, may be further adjusted by means of the adjusting unit 25.

Figure 4:
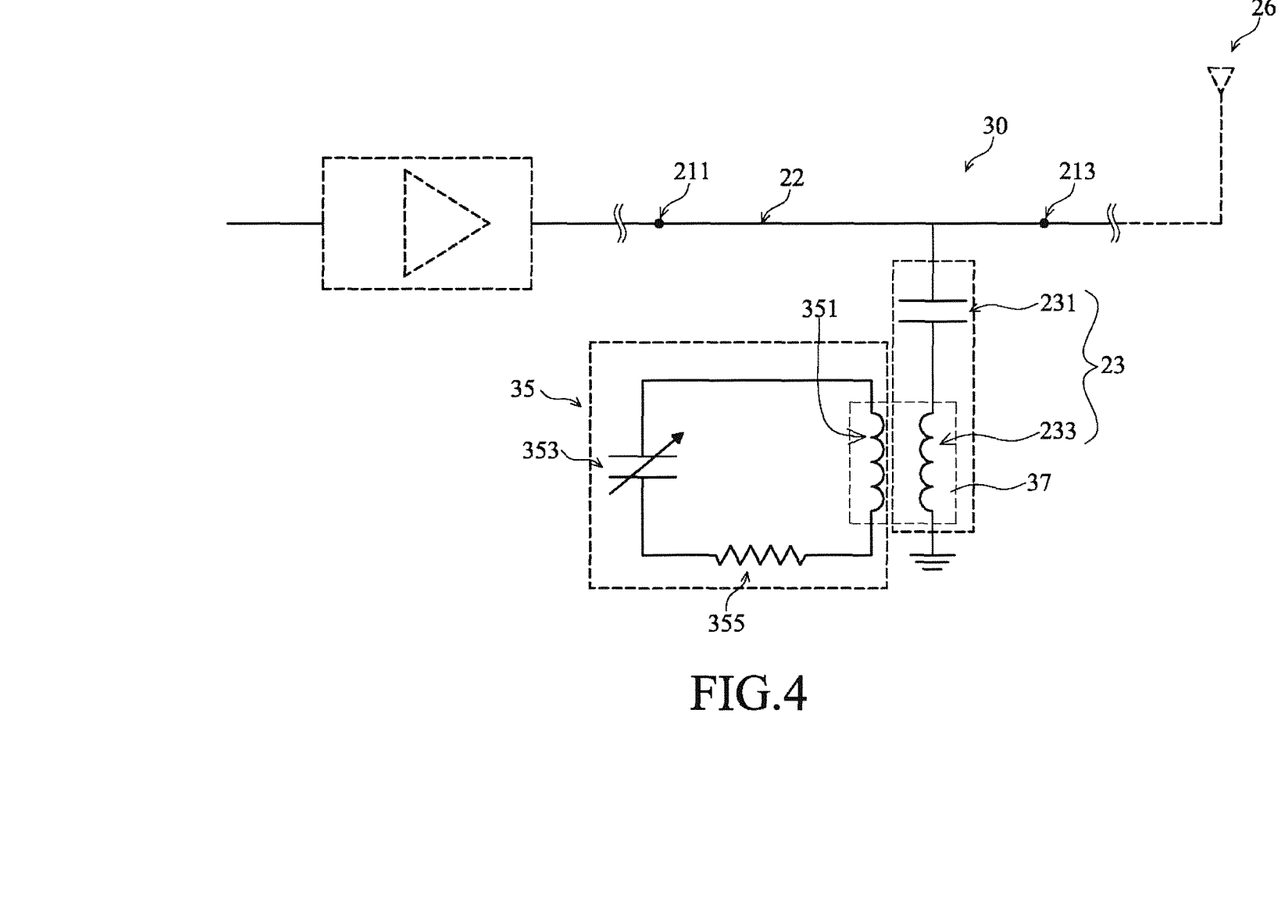
FIG. 4 is a structural diagram of an adjustable harmonic filtering device according to a further embodiment of the present invention.

Referring to FIG. 4, there is shown a structural diagram of an adjustable harmonic filtering device according to a further embodiment of the present invention. As illustrated in the figure, an adjustable harmonic filtering device 30 described in the embodiment of the present invention comprises a first connecting port 211, a second connecting port 213, a harmonic filtering unit 23, and an adjusting unit 35. In this connection, a passive network 22 is presented between the first connecting port 211 and the second connecting port 213. In operation, a signal (such as RF signal, for example) is inputted from the first connecting port 211, and the inputted signal is then sent to the second connecting port 213 via the passive network 22.

The harmonic filtering unit 23 is connected to the passive network 22. For instance, the harmonic filtering unit 23 is connected at at least one end thereof to the passive network 22. The harmonic filtering unit 23 comprises at least one first capacitor 231, at least one first inductor 233, in which the first capacitor 231 is connected to the first inductor 233 in series. In one embodiment of the present invention, the first capacitor 231 and the first inductor 233 connected in series may be electrically connected at one end thereof to the passive network 22, while at the other end thereof to the ground.

The adjusting unit 35 is adjacent to the first inductor 233, and not DC coupled with the first inductor 233. In the embodiment of the present invention, the harmonic filtering unit 23 is adjusted by means of the adjusting unit 35 passively. In this case, the adjusting unit 35 comprises at least one second inductor 351, at least one variable capacitor 353, and/or at least one resistor 355, in which the variable capacitor 353 and/or the resistor 355 may be electrically connected to the second inductor 351. The second inductor 351 is adjacent to the first inductor 233, and electromagnetic induction may be generated therebetween.

When the RF signal is inputted from the first connecting port 211, an AC signal may be generated on the first inductor 233, such that electromagnetic induction is generated between the adjacent second inductor 351 and the first inductor 233. For instance, a balanced-to-unbalanced transformer 37 may be formed by the first inductor 233 and the second inductor 351. In one embodiment of the present invention, capacitance of the variable capacitor 353 and/or coupling coefficient between the first inductor 233 and the second inductor 351 (of the balanced-to-unbalanced transformer 37) may be adjusted on the basis of the frequency-band of the RF signal, so as to change resonant frequency of the adjusting unit 35. Thus, harmonic in the specific frequency-band may be filtered out by the harmonic filtering unit 23. For instance, low impedance is presented in the harmonic filtering unit 23 with respect to the frequency-band, in which the harmonic signal inputted from the first connecting port 211 is located.

Figure 5:
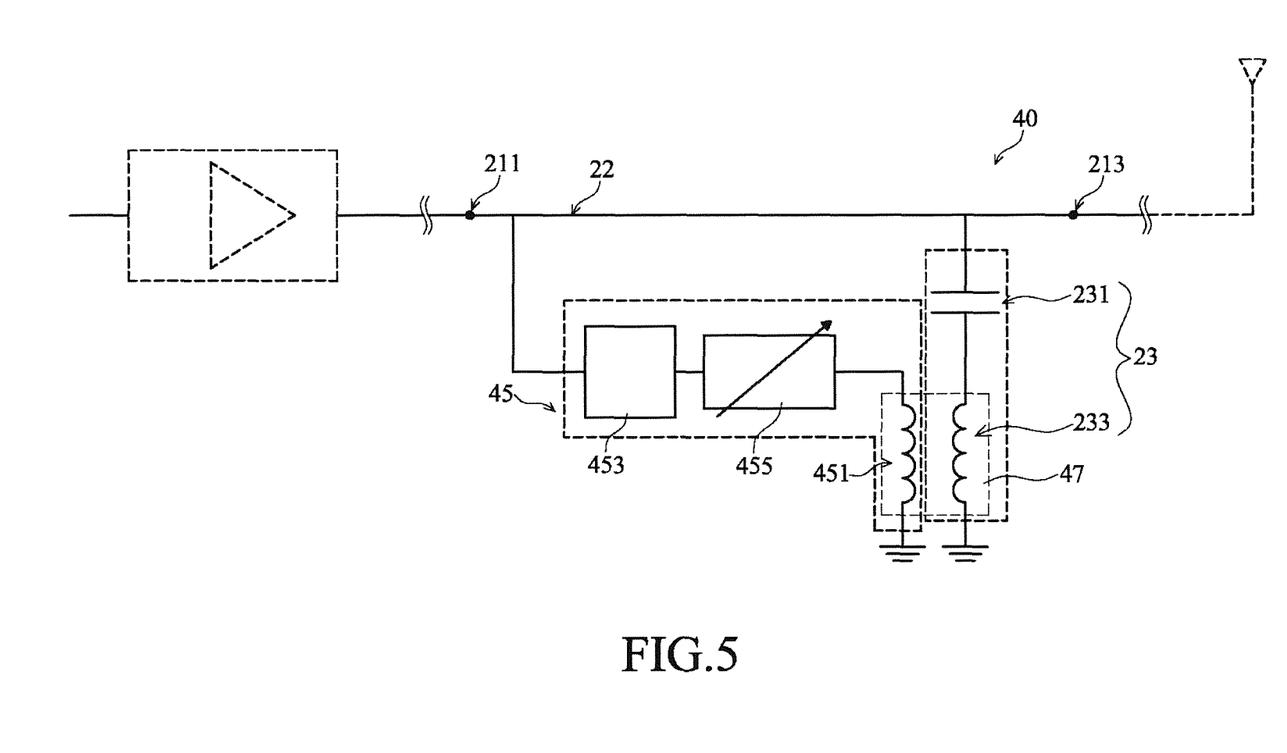
FIG. 5 is a structural diagram of an adjustable harmonic filtering device according to a further embodiment of the present invention.

Referring to FIG. 5, there is shown a structural diagram of an adjustable harmonic filtering device according to a further embodiment of the present invention. As illustrated in the figure, an adjustable harmonic filtering device 40 described in the embodiment of the present invention comprises a first connecting port 211, a second connecting port 213, a harmonic filtering unit 23, and an adjusting unit 45. In this connection, a passive network 22 is presented between the first connecting port 211 and the second connecting port 213. In operation, a signal (such as RF signal, for example) is inputted from the first connecting port 211, and the inputted signal is then sent to the second connecting port 213 via the passive network 22.

The harmonic filtering unit 23 is connected to the passive network 22. For instance, the harmonic filtering unit 23 is connected at at least one end thereof to the passive network 22. The harmonic filtering unit 23 comprises at least one first capacitor 231, at least one first inductor 233, in which the first capacitor 231 is connected to the first inductor 233 in series. In one embodiment of the present invention, the first capacitor 231 and the first inductor 233 connected in series may be electrically connected at one end thereof to the passive network 22, while at the other end thereof to the ground.

The adjusting unit 45 is adjacent to the first inductor 233, and not DC coupled with the first inductor 233. In the embodiment of the present invention, the adjusting unit 45 comprises at least one second inductor 451, a band-pass filtering unit 453, and/or a variable delay unit 455, in which the second inductor 451 is electrically connected to the first connecting port 211 and the passive network 22 via the variable delay unit 455 and/or the band-pass filtering unit 453. Moreover, the second inductor 451 is adjacent to the first inductor 233, such that electromagnetic induction may be generated therebetween. For, instance, a balanced-to-unbalanced transformer 47 may be formed by the first inductor 233 and the second inductor 451.

When the RF signal is inputted from the first connecting port 211, the AC signal may be allowed to pass through both the first inductor 233 and the second inductor 451, such that electromagnetic induction is generated between the second inductor 451 and the first inductor 233. In one embodiment of the present invention, harmonic signal capable of being obtained by the band-pass filtering unit 453 may be changed on the basis of the frequency-band of RF signal. Furthermore, phase delay obtained by the variable delay unit 455 may be adjusted. For instance, phase of harmonic signal to be inputted into the second inductor 451 is adjusted, such that the harmonic signal may be canceled out via electromagnetic induction in the balanced-to-unbalanced transformer 47 formed by the first inductor 233 and the second inductor 451. Thus, the frequency-band of the harmonic, to be filtered out by the harmonic filtering unit 23, may be adjusted. For instance, low impedance is presented in the harmonic filtering unit 23 with respect to the frequency-band of the RF signal inputted from the first connecting port 211.

Figure 6:
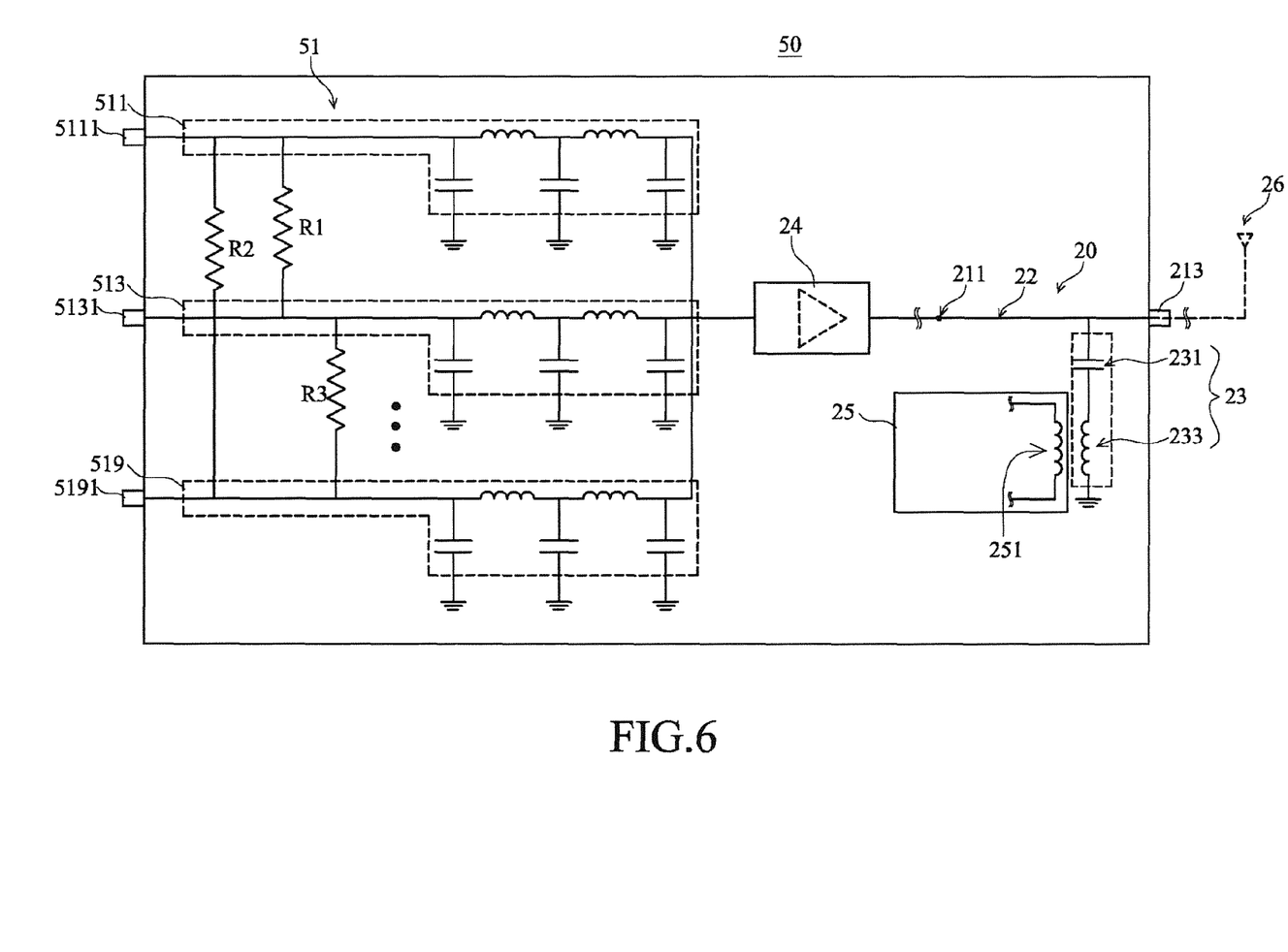
FIG. 6 is a structural diagram of a RF transmitter having an adjustable harmonic filtering device according to one embodiment of the present invention.

Referring to FIG. 6, there is shown a structural diagram of a RF transmitter having an adjustable harmonic filtering device according to one embodiment of the present invention. As illustrated in the figure, a RF transmitter 50 described in the embodiment of the present invention comprises an adjustable harmonic filtering device 20, an amplifying unit 24, and a power combiner 51. In this case, the amplifying unit 24 is connected at one end thereof to the power combiner 51, while at the other end thereof to the adjustable harmonic filtering device 20. Further, the signal to be sent is inputted to the amplifying unit 24 via the power combiner 51, and the inputted signal is then amplified by the amplifying unit 24. Subsequently, the amplified signal is sent to the adjustable harmonic filtering device 20.

The adjustable harmonic filtering device 20 comprises a first connecting port 211, a second connecting port 213, a harmonic filtering unit 23, and an adjusting unit 25. In this case, the first connecting port 211 is connected to the amplifying unit 24, while the second connecting port 213 is connected to an antenna unit 26. In the embodiment of the present invention, the antenna unit 26 is not necessarily provided.

Between the first connecting port 211 and the second connecting port 213, there is provided with a passive network 22. In operation, the signal (such as RF signal, for example) may be inputted from the first connecting port 211, and the inputted signal is then sent to the second connecting port 213 via the passive network 22. The harmonic filtering unit 23 is connected to the passive network 22. For instance, the harmonic filtering unit 23 is connected at at least one end thereof to the passive network 22. In the embodiment of the present invention, the harmonic filtering unit 23 comprises at least one first capacitor 231 and at least one first inductor 233, in which the first capacitor 231 is connected to the first inductor 233 in series, as well as the first capacitor 231 and the first inductor 233 connected in series may be connected at one end thereof to the passive network 22.

The adjusting unit 25 is adjacent to the first inductor 233, and not DC coupled with the first inductor 233. In practical application, the frequency-band of the harmonic to be filtered out by the harmonic filtering unit 23 and the adjustable harmonic filtering device 20 may be adjusted by changing intensity of electromagnetic induction between the adjacent first inductor 233 and the second inductor 251.

For the convenience of description, the adjustable harmonic filtering device 20 is taken for explanation in principle in the embodiment of the present invention. In practical application, however, the adjustable harmonic filtering devices 200/30/40 illustrated in FIGS. 3, 4, and 5 may be also applied to the RF transmitter 50 described in the embodiment of the present invention, such as replacing the adjustable harmonic filtering device 20, for example, to adjust the frequency-band of the harmonic to be filtered out similarly.

The power combiner 51 comprises a plurality of matching networks 511/513/519, each of the matching networks 511/513/519 comprising at least one inductor and/or at least one capacitor and being connected to each other via at least one resistor. In this way, the inductors and/or capacitors of one matching network 511/513/519 may be shared with another matching network. Thus, the area provided for the power combiner 51 may be reduced effectively.

In one embodiment of the present invention, the matching networks comprise a first matching network 511, a second matching network 513, . . . and an Nth matching network 519. In this case, the first matching network 511 is connected to the second matching network 513 via the first resistor R1, and to the Nth matching network 519 via the second resistor R2, while the second matching network 513 is connected to the Nth matching network 519 via the third resistor R3.

Similar impedance may be provided for each of the input ports 5111/5131/5191 of the matching networks 511/513/519 with respect to signals in different frequency-bands, respectively, due to that fact that the inductors and/or capacitors of one matching network 511/513/519 are shared with other matching networks. For instance, impedance presented in the first input port 5111 of the first matching network 511 with respect to the signal in the first frequency-band is a first impedance; impedance presented in the second input port 5311 of the second matching network 531 with respect to the signal in the second frequency-band is a second impedance; impedance presented in the Nth input port 5191 of the Nth matching network 519 with respect to the signal in the Nth frequency-band is a Nth impedance. In this case, the first impedance, the second impedance, and the Nth impedance are approximately the same.

In practical application, the signal may be inputted via the input port 5111/5131/5191 of one suitable matching network 511/513/519 selectively on the basis of the frequency-band of signal to be sent desirably, in such a way that impedance in the power combiner 51 with respect to the signal to be sent desirably may meet expectations, similarly reducing loss of signal generated when the signal is inputted from the input port 5111/5131/5191. For instance, the signal in the first frequency-band is inputted via the first input port 5111, the signal in the second frequency-band is inputted via the second input port 5131, and the signal in the Nth frequency-band is inputted via the Nth input port 5191, where the first frequency-band, the second frequency-band, and the Nth frequency-band are all located in different ranges. For instance, there exists a multiple relationship among the first frequency-band, the second frequency-band, and the Nth frequency-band.

In one embodiment of the present invention, the capacitors and/or the inductors of each matching network 511/513/519 are connected in series, the capacitors and/or the inductors connected in series of each matching network 511/513/519 being provided between each input port 5111/5131/5191 and the amplifying unit 24, respectively. In another embodiment of the present invention, a part of capacitors and/or inductors of each matching network 511/513/519 are connected in series, while each of the other part of capacitors and/or inductors thereof is connected at one end thereof to the capacitors and/or the inductors connected in series, and at the other end thereof to the ground. In practical application, the locations of the capacitors and/or the inductors may be also adjusted, such that impedance in each matching network 511/513/519 may meet expectations.

Integration of the plurality of matching networks 511/513/519 into one power combiner 51 is allowed for not only reducing the area provided for the power combiner 51, but also achieving the object of sharing the amplifying unit 24. For instance, the RF transmitter 50 in the embodiment of the present invention may be provided with only one single amplifying unit 24, instead of several amplifying units (111/113) required for the prior art. Thus, the size and setup cost of RF transmitter 50 may be reduced further.

The adjustable harmonic filtering device 20/200/30/40 described in the present invention may be a notch filter with function of adjustment, used for filtering out the specific frequency-band multiplied by one, two, three, or any multiple. Thus, interference on signal transmission may be reduced further with enhanced power added efficiency (PAE).

It is to be understood the invention is not limited to particular systems or methods described which may, of course, vary. It is also to be understood that the terminology used herein is for the purpose of describing particular embodiments only, and is not intended to be limiting. As used in this specification, the singular forms "a", "an" and "the" include plural referents unless the content clearly indicates otherwise. Thus, for example, reference to "a device" includes a combination of two or more devices and reference to "a material" includes mixtures of materials.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

The invention claimed is:

1. An adjustable harmonic filtering device, comprising:
 a first connecting port;
 a second connecting port, wherein a passive network is presented between said first connecting port and said second connecting port;
 a harmonic filtering unit, connected to said passive network, and including at least one first capacitor and at least one first inductor, said at least one first inductor is connected to said at least one first capacitor in series; and
 an adjusting unit, adjacent to said at least one first inductor of said harmonic filtering unit, and induced electromagnetically with said at least one first inductor, so as to change a frequency-band of a harmonic to be filtered out by said harmonic filtering unit,
 said adjusting unit including at least one second inductor, said at least one second inductor being adjacent to said at least one first inductor of said harmonic filtering unit, and induced electromagnetically with said at least one first inductor, said adjusting unit further including a band-pass filtering unit and a variable delay unit, said second inductor being electrically connected to said first connecting port via said band-pass filtering unit and said variable delay unit.

2. An adjustable harmonic filtering device, comprising:
 a first connecting port;
 a second connecting port, wherein a passive network is presented between said first connecting port and said second connecting port;
 a harmonic filtering unit, connected to said passive network, and including at least one first capacitor and at least one first inductor, said at least one first inductor is connected to said at least one first capacitor in series; and
 an adjusting unit including at least one second inductor, said at least one second inductor being adjacent to said at least one first inductor of said harmonic filtering unit, and induced electromagnetically with said at least one first inductor, so as to change a frequency-band of a harmonic to be filtered out by said harmonic filtering unit,
 said first connecting port of said adjustable harmonic filtering device is electrically connected to an output of an amplifying unit, said second connecting port is electrically connected to an antenna unit, and an input of said amplifying unit is electrically connected to an output of a power combiner, said power combiner including a plurality of matching networks, each of said matching networks including at least one matching network capacitor and at least one matching network inductor.

3. The adjustable harmonic filtering device according to claim 2, wherein each of said matching networks is connected to each other via at least one resistor.

4. An adjustable harmonic filtering device, comprising:
 a first connecting port;
 a second connecting port, wherein a passive network is presented between said first connecting port and said second connecting port;
 a harmonic filtering unit, connected to said second connecting port, and including at least one first capacitor and at least one first inductor, said at least one first inductor is connected to said at least one first capacitor in series; and an adjusting unit, adjacent to said at least one first inductor of said harmonic filtering unit, and induced electromagnetically with said at least one first inductor, so as to change a frequency-band of a harmonic to be filtered out by said harmonic filtering unit, said adjusting unit including at least one second inductor, said at least one second inductor being adjacent to said at least one first inductor of said harmonic filtering unit, and induced electromagnetically with said at least one first inductor, said adjusting unit further including at least one variable capacitor and at least one resistor, said at least one variable capacitor and said at least one resistor being electrically connected to said at least one second inductor.

5. The adjustable harmonic filtering device according to claim 4, wherein said first connecting port is electrically connected to an output of an amplifying unit, while said second connecting port is electrically connected to an antenna unit.

6. The adjustable harmonic filtering device according to claim 5, wherein a RF signal is sent to said antenna unit from said amplifying unit via said passive network.

7. The adjustable harmonic filtering device according to claim 6, wherein a capacitance of said variable capacitor is adjusted on the basis of a frequency-band of said RF signal, so as to change said frequency-band of said harmonic to be filtered out by said harmonic filtering unit.

8. The adjustable harmonic filtering device according to claim 4, wherein said harmonic filtering unit is connected at at least one end thereof to said passive network between said first connecting port and said second connecting port.

* * * * *